(12) United States Patent
Blauvelt et al.

(10) Patent No.: US 7,543,993 B2
(45) Date of Patent: Jun. 9, 2009

(54) FIBER-COUPLED OPTICAL DEVICE MOUNTED ON A CIRCUIT BOARD

(75) Inventors: Henry A. Blauvelt, San Marino, CA (US); Albert M. Benzoni, South Pasadena, CA (US); Gerald C. Byrd, North Hollywood, CA (US)

(73) Assignee: HOYA Corporation USA, San Jose, CA (US)

( * ) Notice: Subject to any disclaimer, the term of this patent is extended or adjusted under 35 U.S.C. 154(b) by 0 days.

(21) Appl. No.: 11/681,352

(22) Filed: Mar. 2, 2007

(65) Prior Publication Data

US 2007/0206902 A1    Sep. 6, 2007

Related U.S. Application Data

(60) Provisional application No. 60/821,181, filed on Aug. 2, 2006, provisional application No. 60/778,777, filed on Mar. 3, 2006.

(51) Int. Cl.
*G02B 6/36*        (2006.01)
(52) U.S. Cl. .......................... 385/88; 385/14; 385/49; 385/92
(58) Field of Classification Search ............... 385/14, 385/49, 88–94
See application file for complete search history.

(56) References Cited

U.S. PATENT DOCUMENTS

| | | | |
|---|---|---|---|
| 4,307,934 A | 12/1981 | Palmer et al. | |
| 4,830,456 A | 5/1989 | Kakii et al. | |
| 4,983,012 A | 1/1991 | Saito et al. | |
| 5,125,057 A | 6/1992 | Aberson, Jr. et al. | |
| 5,245,683 A | 9/1993 | Belenkiy et al. | |
| 5,687,267 A | 11/1997 | Uchida et al. | |
| 5,737,467 A | 4/1998 | Kato et al. | |
| 5,961,849 A | 10/1999 | Bostock et al. | |
| 6,238,100 B1 | 5/2001 | Sasaki et al. | |
| 6,483,968 B2 | 11/2002 | Fuse et al. | |
| 6,513,993 B1 * | 2/2003 | Nakanishi et al. ............. | 385/92 |
| 6,524,017 B2 * | 2/2003 | Lecocq et al. ................. | 385/88 |

(Continued)

OTHER PUBLICATIONS

International Search Report and Written Opinion for PCT App. No. PCT/US2007/063245.

(Continued)

*Primary Examiner*—Hemang Sanghavi
(74) *Attorney, Agent, or Firm*—David S. Alavi

(57) ABSTRACT

An optical apparatus comprises: an optical fiber, an optical device on a substrate, a circuit board, and an electrical connection therebetween. The substrate has a groove for positioning the fiber for optical coupling with the optical device. A proximal segment of the fiber is secured to the substrate in the groove. The substrate is mounted on the circuit board, and a second segment of the fiber is secured to the circuit board. A method comprises: mounting on the circuit board the substrate with the optical device; establishing the electrical connection; securing the proximal fiber segment to the substrate in the groove; and securing the second fiber segment to the circuit board. Multiple substrates can be secured to a single piece of circuit board material, which can be divided into individual circuit boards after establishing electrical connections and securing optical fibers to the corresponding substrates and to the circuit board material.

79 Claims, 9 Drawing Sheets

U.S. PATENT DOCUMENTS

| | | | |
|---|---|---|---|
| 6,527,458 B2 * | 3/2003 | Kim | 385/89 |
| 6,530,701 B2 | 3/2003 | Jin | |
| 6,842,558 B2 | 1/2005 | Mitsuka et al. | |
| 6,905,569 B2 | 6/2005 | Kim et al. | |
| 6,942,397 B2 | 9/2005 | Benzoni et al. | |
| 7,035,485 B2 | 4/2006 | Kondo et al. | |
| 7,223,025 B2 | 5/2007 | Benzoni et al. | |
| 2001/0017964 A1 * | 8/2001 | Setoguchi | 385/88 |
| 2002/0168152 A1 | 11/2002 | Abe et al. | |
| 2003/0235378 A1 * | 12/2003 | Yamaguchi | 385/92 |
| 2005/0157972 A1 * | 7/2005 | Kuhara et al. | 385/14 |
| 2007/0223864 A1 | 9/2007 | Benzoni et al. | |
| 2008/0085083 A1 * | 4/2008 | Pizzarulli | 385/89 |

OTHER PUBLICATIONS

Abe, et al, "Study of surface mounting of PLC on optical fibre circuit board," "Electronics Letters", May 10, 2001, pp. 623-624, vol. 37, No. 10.

Asakawa, et al, "PLC connector with fibre physical contact," "Electronics Letters", Sep. 25, 1997, pp. 1730-1731, vol. 33, No. 20.

Asakawa, et al, "PLC Connector w PLC-Fiber Physical Contact for Multichannel Receptacle PLC Modules for Optical Circuit Board Integration", "Journal of Lightwave Technology", Mar. 2003, pp. 821-830, vol. 21, No. 3.

* cited by examiner

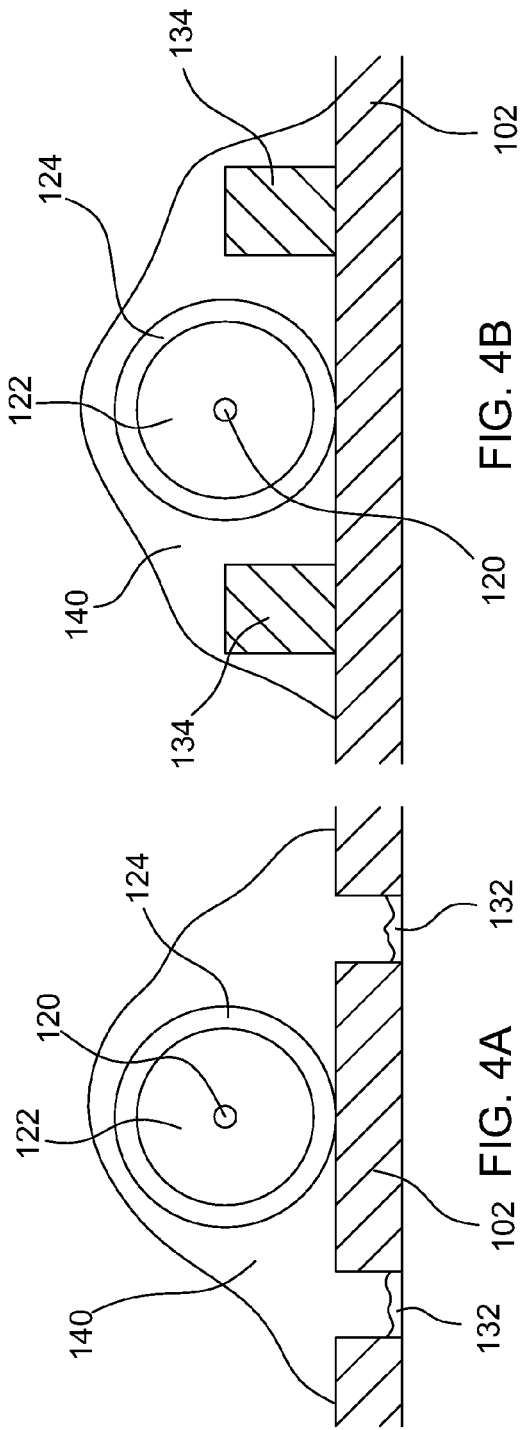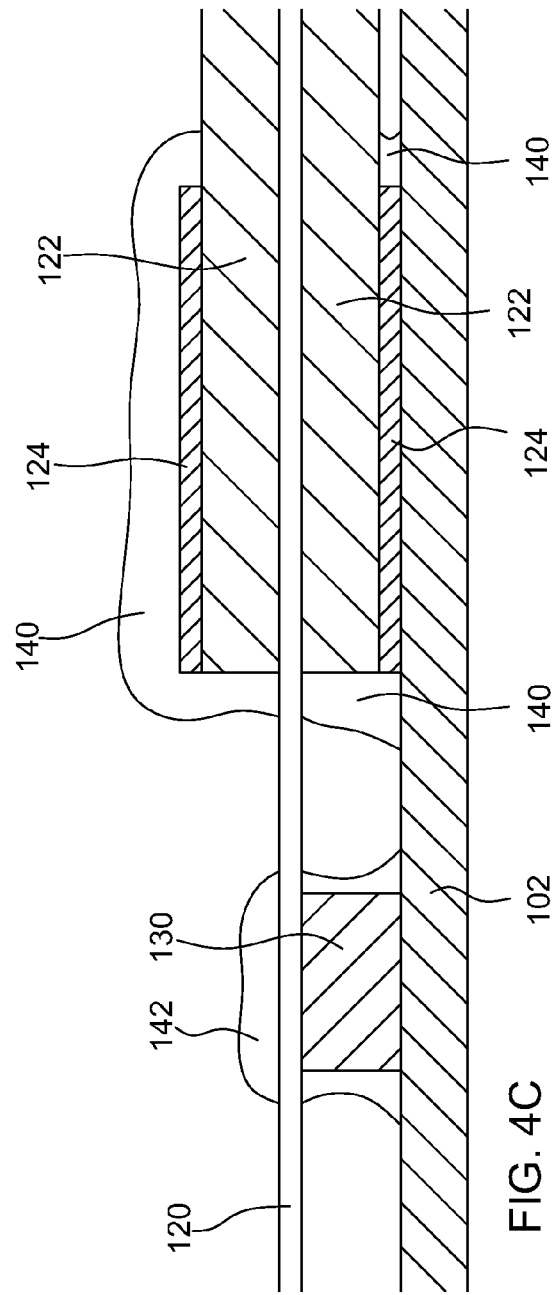

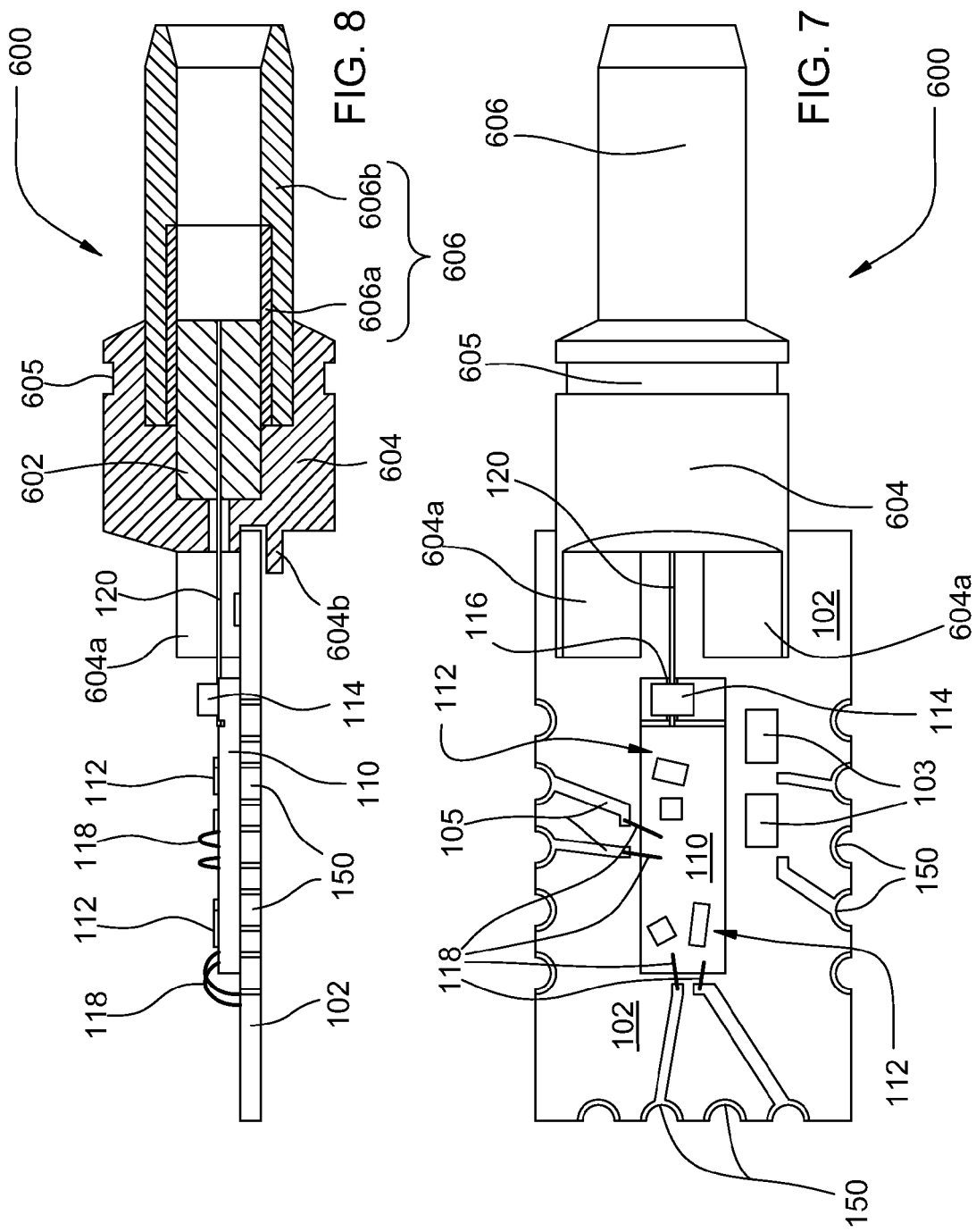

US 7,543,993 B2

FIBER-COUPLED OPTICAL DEVICE MOUNTED ON A CIRCUIT BOARD

BENEFIT CLAIMS TO RELATED APPLICATIONS

This application claims benefit of U.S. provisional App. No. 60/778,777 filed Mar. 3, 2006 and U.S. provisional App. No. 60/821,181 filed Aug. 2, 2006, said provisional applications being hereby incorporated by reference as if fully set forth herein.

BACKGROUND

The field of the present invention relates to fiber-coupled optical devices mounted on circuit boards.

Packaging an optical component for ready coupling to an optical fiber is a costly and time consuming portion of the manufacturing process for optical devices for telecommunications. Connectors are available for enabling rapid connection between optical fibers, an end of each fiber being provided with one of a pair of mating connectors. In order to provide a packaged optical device with such a connector, it is often the case that a short segment of optical fiber is employed within the package, with one end optically coupled to the device and the other end terminating in the connector and available for coupling to another optical fiber with a mating connector.

In many typical applications, the optical device is coupled to electronic circuitry for use. It may be desirable in such circumstances to mount the fiber-coupled optical device directly on a circuit board for facilitating coupling between the device and the circuitry. Disclosed herein are various embodiments of such circuit-mounted fiber-coupled optical devices, and methods of fabrication and use thereof.

SUMMARY

An optical apparatus comprises: an optical fiber, an optical device on a device substrate, a circuit board, and at least one electrical connection between the optical device and the circuit board. The device substrate has a groove for receiving the optical fiber and for positioning the proximal end of the optical fiber to establish optical coupling between the optical fiber and the optical device. A first segment at or near the proximal end of the optical fiber is secured to the device substrate in the groove. The device substrate is mounted on the circuit board, and a second segment of the optical fiber (distal to the first fiber segment) is secured to the circuit board.

A method for making the optical apparatus comprises: mounting on the circuit board the device substrate with the optical device; establishing the at least one electrical connection; securing the first fiber segment to the device substrate in the groove to establish the optical coupling; and securing the second fiber segment to the circuit board. Multiple device substrates can be secured to a single piece of circuit board material, which can be divided into individual circuit boards after establishing electrical connections and after securing optical fibers to the corresponding device substrates and to the circuit board material.

Objects and advantages pertaining to circuit-board-mounted, fiber-coupled optical devices may become apparent upon referring to the exemplary embodiments illustrated in the drawings and disclosed in the following written description or claims.

BRIEF DESCRIPTION OF THE DRAWINGS

FIGS. 4A-4C are schematic cross sectional views of an optical fiber secured to a circuit board.

FIG. 7 is a plan view of an exemplary embodiment of a fiber-coupled optical device mounted on a circuit board.

FIG. 8 is a side elevation view of an exemplary embodiment of a fiber-coupled optical device mounted on a circuit board.

The embodiments shown in the Figures are exemplary, and should not be construed as limiting the scope of the present disclosure or appended claims.

DETAILED DESCRIPTION OF EMBODIMENTS

Figure 1:
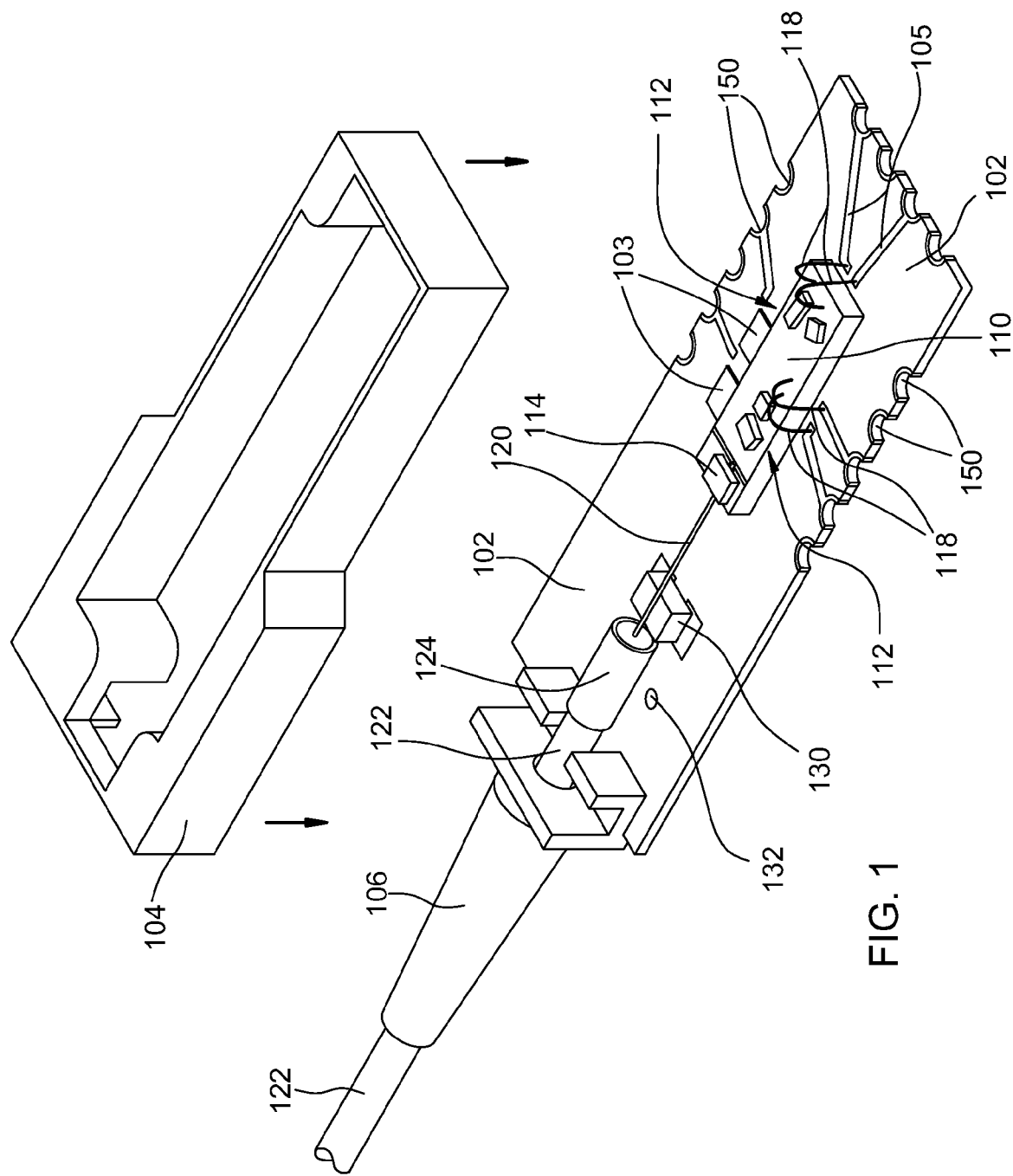
FIG. 1 is a perspective view of an exemplary embodiment of a fiber-coupled optical device mounted on a circuit board, and a housing therefor.
Figure 3:
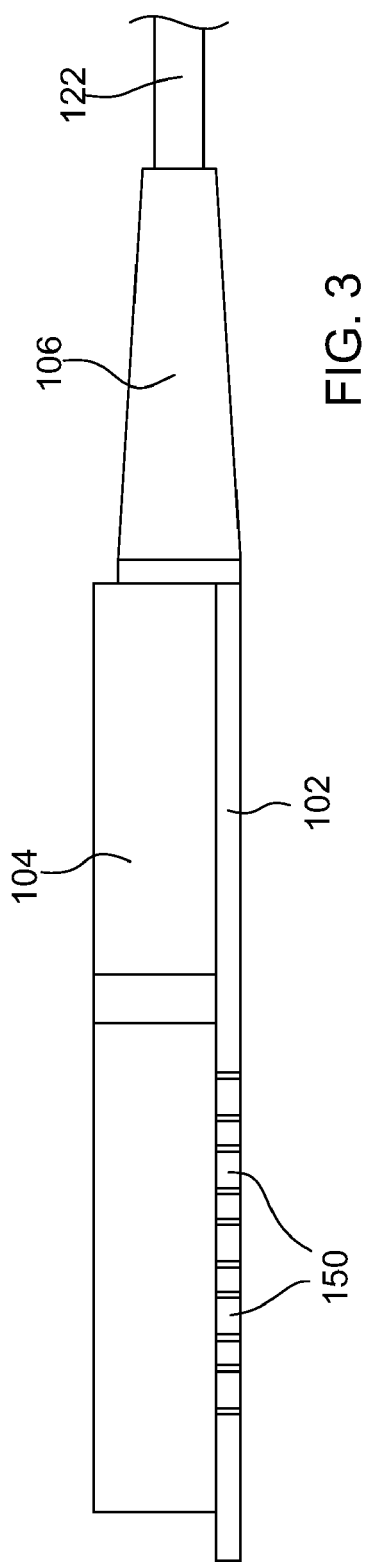
FIG. 3 is a side elevation view of an exemplary embodiment of a housing for a fiber-coupled optical device mounted on a circuit board.
Figure 2:
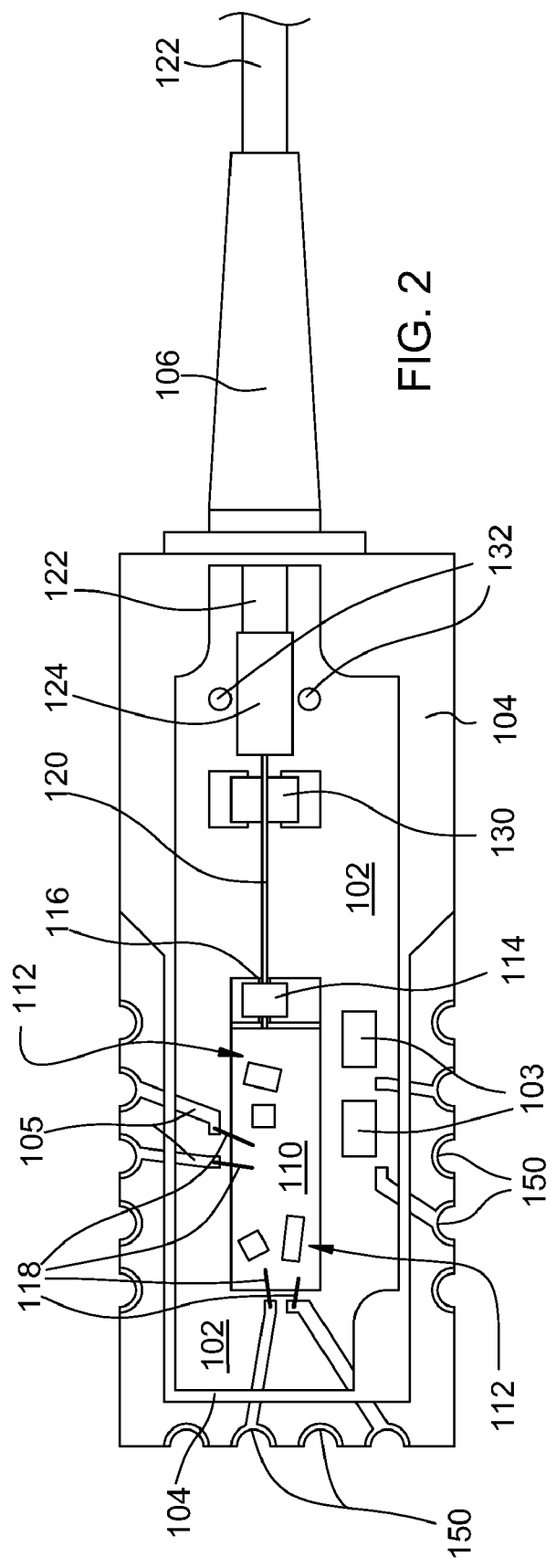
FIG. 2 is a plan view of an exemplary embodiment of a fiber-coupled optical device mounted on a circuit board within a housing.

An optical apparatus is shown in FIGS. 1-3, and comprises: an optical fiber 120; one or more optical devices 112 on a device substrate 110; a circuit board 102; and at least one electrical connection 118 between optical device 112 and circuit board 102. Optical device 112 may comprise any desired optical component or device or set of optical components or devices, and may include (but is not limited to) one or more lasers, other optical sources, modulators, photodetectors, other optical receivers, other active optical components or devices, optical waveguides, optical couplers, reflectors, lenses, gratings, isolators, filters, other passive optical components, or other desired optical component(s). Electrical connection 118 may comprise one or more wire bonds between (a) a trace or contact 105 on circuit board 102 or an electronic component 103 on circuit board 102, and (b) device 112 or a trace or contact on device substrate 110 coupled to optical device 112. Any other suitable type or configuration may be employed for electrical connection 118. Device substrate 110 has a groove 116 for receiving and positioning a proximal end of optical fiber 120 to establish optical coupling between the proximal end of optical fiber 120 and optical device 112. A first fiber segment at or near the proximal end of optical fiber 120 is secured to device substrate 110 in groove 116 (which is mostly obscured in the drawings). "Near" the proximal end of optical fiber 120 means that the proximal end of optical fiber 120 might extend beyond groove 116, but not far enough to permit movement of the proximal fiber end sufficient to substantially affect optical coupling between optical fiber 120 and optical device 112. Device substrate 110 is mounted on circuit board 102, and a second segment of optical fiber 120 (distal to the first fiber segment) is secured to circuit board 102. The second fiber segment may be secured directly to circuit board 102, or may pass through a fiber buffer 122 that is in turn secured to circuit board 102. Buffer 122 may typically comprise one or more of polyvinyl chloride (PVC), Hytrel®, nylon, Kevlar®, or other suitable material, and any suitable buffer material or combination of buffer materials shall fall within the scope of the present disclosure or appended claims. Buffer 122 shall preferably comprise material(s) compatible with subsequent assembly, processing, or curing steps disclosed hereinbelow.

As shown in FIG. 1, device substrate 110 is secured to a substantially flat region of circuit board 102. Likewise, buffer 122 (and hence the second segment of fiber 120) is secured to a substantially flat region of circuit board 102. Those two substantially flat regions of circuit board 102 are substantially coplanar. The arrangement of device substrate 110, buffer 122, and optical fiber 120 results in at least a portion of the fiber 120 being vertically spaced-apart from the regions of the circuit board 102 to which the device substrate 110 and buffer 122 are secured.

It should be noted that in any of the embodiments disclosed herein, multiple grooves can be formed on a single device substrate for receiving multiple optical fibers. The multiple optical fibers are optically coupled to one or more optical devices on the device substrate, and the device substrate is mounted on a circuit board. The multiple optical fibers can be secured to the device substrate and to the circuit board as described in any of the embodiments disclosed herein.

The optical apparatus may further comprise adhesive 140 for securing the second fiber segment (directly or via buffer 122) to circuit board 102 (FIGS. 4A-4C). Adhesive 140 may typically comprise a hardened material that had flowed into place during at least a portion of its application. For example, adhesive 140 may comprise cured polymer, reflowed polymer, reflowed solder, reflowed glass, fused glass frit, or other similarly suitable material. One example of a suitable cured polymer is a cured epoxy resin; other suitable adhesives or adhesive means may be employed as well, including adhesives that do not flow during application. If desired, crimp tube 124 can be crimped onto buffer 122 and secured to circuit board 102 by adhesive 140 (FIGS. 4A-4C), thereby securing buffer 122 to circuit board 102. The presence of crimp tube 124 has been observed to result in a more secure attachment of buffer 122 to circuit board 102 by adhesive 140. Adhesive 140 can cover at least a portion of crimp tube 122 and a portion of buffer 122 beyond one or both ends of crimp tube 124.

To further secure the attachment of buffer 122 (or direct attachment of the second segment of optical fiber 120) to circuit board 102, the apparatus may further comprise depressions 132 in or protrusions 134 on circuit board 102 (FIGS. 4A and 4B, respectively). Depressions 132 or protrusions 134 are positioned near the secured segment of buffer 122 and are at least partly covered by adhesive 140. Depressions 132 may comprise vias through circuit board 102 that are at least partly filled with adhesive 140. Depressions 132 are shown in the drawings laterally displaced from the secured portion of buffer 122, however, those locations are exemplary. Depressions 132 can be arranged laterally displaced from buffer 122, directly below buffer 122, or in any other suitable position for enhancing adhesion of buffer 122 (or optical fiber 120 or crimp tube 124) to circuit board 102. Protrusions 134 may comprise a member formed on or secured to circuit board 102 in any suitable way and at least partly covered by adhesive 140. Any suitable arrangement of protrusions 134 may be employed for enhancing adhesion of buffer 122 (or optical fiber 120 or crimp tube 124) to circuit board 102. Such a secured member can comprise an electrical component mounted on circuit board 102, which may be secured to circuit board 102 by solder or adhesive (such as epoxy resin, for example), and can also serve as a portion of an electronic circuit on circuit board 102.

The apparatus may further comprise a fiber support member 130 on circuit board 102 beneath a portion of optical fiber 120 between the first (i.e. proximal) fiber segment secured to device substrate 110 and the second fiber segment secured to circuit board 102 (directly or via buffer 122 or via crimp tube 124). At least a portion of optical fiber 120 is secured to fiber support member 130. Adhesive 142 may be employed for securing at least a portion of optical fiber 120 to fiber support member 130 (FIG. 4C). As described hereinabove, adhesive 142 may comprise a hardened material that had flowed into place during at least a portion of its application, and may comprise cured polymer, reflowed polymer, reflowed solder, reflowed glass, fused glass frit, or other similarly suitable adhesive or adhesive means. One example of a suitable material is a cured epoxy resin; other suitable adhesives or adhesive means may be employed as well, including adhesives that do not flow during application. Fiber support member 130 may comprise a member formed on or secured to circuit board 102 in any suitable way and at least partly covered by adhesive 142. Fiber support member 130 can comprise an electrical component mounted on circuit board 102, which may be secured to circuit board 102 by solder or adhesive (such as epoxy resin, for example), and can also serve as a portion of an electronic circuit on circuit board 102. Adhesives 140 and 142 may comprise discrete volumes of material (as in FIG. 4C), or may together comprise a single volume of material at least partly covering the secured portion of buffer 122 (or fiber 120 or crimp tube 124) as well as the portion of optical fiber 120 secured to fiber support member 130.

The apparatus may further comprise a fiber retainer 114 positioned over at least a portion of groove 116 and secured to device substrate 110 to secure the first segment of optical fiber 120 to device substrate 110 in groove 116. Adhesive (obscured in the drawings) may be employed for securing fiber retainer 114 to device substrate 110 as described in U.S. Pat. Pub. No. 2006/0002664 A1, said publication being hereby incorporated by reference as if fully set forth herein. Any of the arrangements or adaptations disclosed therein for a fiber retainer may be employed while remaining within the scope of the present disclosure or appended claims. As already described, the adhesive may comprise a hardened material that had flowed into place during at least a portion of its application, and may comprise cured polymer, reflowed polymer, reflowed solder, reflowed glass, fused glass frit, or other similarly suitable adhesive or adhesive means (such as a cured epoxy resin, for example). Other suitable adhesives or adhesive means may be employed as well, including adhesives that do not flow during application.

The optical apparatus can further comprise an index-matching material between optical device 112 and the end of the optical fiber. Such an index-matching material can flow into place during application and then cure or harden, or can be placed between optical device 112 and the end of the optical fiber by any other suitable means. One example of a suitable material is an index-matching silicone polymer; any other suitable material can be employed. The optical apparatus can further comprise an encapsulant 704 substantially covering optical device 112, device substrate 110, and proximal segment 120 of the optical fiber (shown on FIGS. 10 and 11). Such an encapsulant can serve to protect the apparatus from a use environment, and can comprise any suitable material. One example of a suitable encapsulant material is a silicone elastomer; any other suitable material can be employed. If needed or desired, the apparatus can further comprise a housing 104 secured to circuit board 102 and having walls that substantially surround an area of circuit board 102 containing optical device 112, device substrate 110, and proximal segment 120 of the optical fiber, and can further comprise a lid substantially covering the surrounded area. An encapsulant (if employed) can substantially cover all or some of the area of circuit board 102 surrounded by housing 104. If needed or desired, a strain-relief or bend-limiting structure 106 can be attached to housing 104 or circuit board 102 to restrict bending of the optical fiber near circuit board 102.

Figure 5:
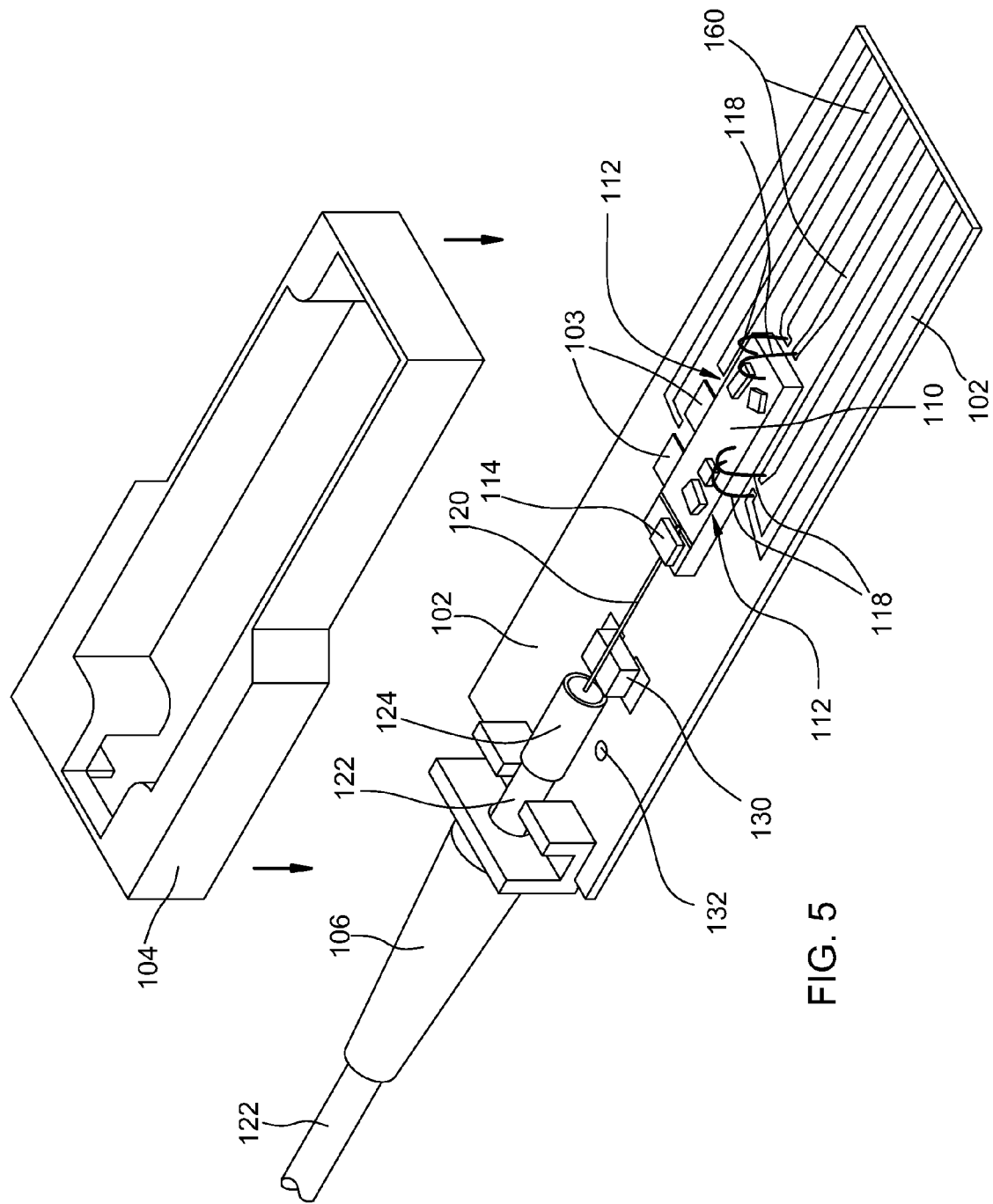
FIG. 5 is a perspective view of an exemplary embodiment of a fiber-coupled optical device mounted on a circuit board, and a housing therefor.

As shown in the drawings, circuit board 102 is made as small as practicable, and is suitable for in turn being mounted on a larger system circuit board as one of a plurality of components or subassemblies thereon. Such a so-called "boardlet" configuration enables ready integration of a fiber-coupled optical device (transmitter, receiver, bidirectional transceiver, and so on) into an electronic device, for enabling optical data transmission to or from the electronic device via the optical fiber. In such a configuration circuit board 102 may comprise any structure(s) or adaptation(s) suitable for enabling electrical connections between circuit board 102 and the system circuit board. For example, in FIGS. 1-3 electrical connections are established via contacts 150 formed on the edge of circuit board 102. Alternatively, pins may be pre-inserted through circuit board 102 to protrude below circuit board 102 to mate with a suitably configured receptacle on the system circuit board. In either of these "boardlet" arrangements, mechanical alignment pins may be provided for positioning the "boardlet" on the system circuit board. Such alignment pins may be arranged for engaging mating holes on the system circuit board in any suitable way, and may be provided on circuit board 102 or provided on housing 104 extending through circuit board 102. In another alternative embodiment (not shown), the optical device substrate 110 and optical fiber buffer 122 may be secured directly to the system circuit board (which would therefore be designated as circuit board 102) for integration into the electronic device. Such a configuration might be referred to as "chip-on-board". In another alternative embodiment (FIG. 5), conductive traces 160 may extend to an edge of circuit board 102, which may in turn be inserted into a receptacle slot having mating conductive members. Such an arrangement may be suitable, for example, for incorporating the circuit board 102 (with optical device 110 thereon) into a so-called active fiber-optic cable.

A method for making the optical apparatus comprises: mounting on circuit board 102 device substrate 110 with one or more optical devices 112 and groove 116; establishing electrical connection(s) 118 between optical device 112 and circuit board 102; securing a first (proximal) segment of optical fiber 120 to device substrate 110 in groove 116; and securing a second segment of optical fiber 120 (distal to the first fiber segment) to circuit board 102. The second fiber segment may be secured directly to circuit board 102, or secured via a fiber buffer 122 or crimp tube 124. The method may further comprise applying adhesive 140 for securing buffer 122 or optical fiber 120 to circuit board 102, as variously described hereinabove. The method may further comprise positioning fiber support member 130 on circuit board 102 and securing at least a portion of optical fiber 120 to fiber support member 130, as variously described hereinabove, including application of adhesive 142. The method may further comprise securing fiber retainer 114 to device substrate 110 over at least a portion of groove 116 to secure the first fiber segment to device substrate 110 in groove 116, as variously described hereinabove, including application of adhesive. The method may further comprise substantially covering optical device 112, device substrate 110, and proximal segment 120 of the optical fiber with an encapsulant 704, or securing housing 104 to circuit board 102 substantially surrounding an area of circuit board 102 containing optical device 112, device substrate 110, and proximal segment 120 of the optical fiber.

An alternative embodiment of a fiber-coupled optical device mounted on a circuit board is shown in FIGS. 6-9, in which the second segment of the optical fiber 120 is secured to a receptacle connector 600 which is in turn secured to circuit board 102. The receptacle connector 600 comprises a fiber ferrule 602, a ferrule holder 604, and a ferrule sleeve 606. The optical fiber 120 is secured to ferrule 602 with its distal end substantially flush with the distal end of ferrule 602, with its proximal end protruding from the proximal end of ferrule 602, and with its second segment within ferrule 602 (typically secured to the ferrule with epoxy or other suitable adhesive; any suitable means for securing the fiber to the ferrule can be employed). The optical fiber 120 in this embodiment is typically (though not necessarily) stripped of any buffer or outer coating. Fiber ferrule 602 comprises ceramic or other suitable material(s). Ferrule holder 604 comprises plastic, metal, or other suitable material(s), and fiber ferrule 602 is secured to ferrule holder 604 in any suitable way, including press fit, adhesive, retainer(s), detent(s), welding, and so forth. When fiber ferrule 602 and ferrule holder 604 are assembled, the proximal end of optical fiber 120 protrudes from the proximal end of ferrule holder 604, while the distal ends of optical fiber 120 and fiber ferrule 602 are recessed within the ferrule holder 604. The ferrule holder 604 is secured by adhesive or other suitable means to the circuit board 102, thereby securing the second segment of the optical fiber 120 to the circuit board 102 (through fiber ferrule 602 and ferrule holder 604). The ferrule holder 604 is positioned on circuit board 102 so as to position the first segment of the optical fiber 120 in groove 116 on device substrate 110. The first segment of optical fiber 120 is secured to the device substrate 110 in groove 116 in any suitable way, including those described hereinabove. The device substrate 110 and the proximal end of optical fiber 120 can be encapsulated or enclosed in a housing, as described hereinabove.

Figure 6:
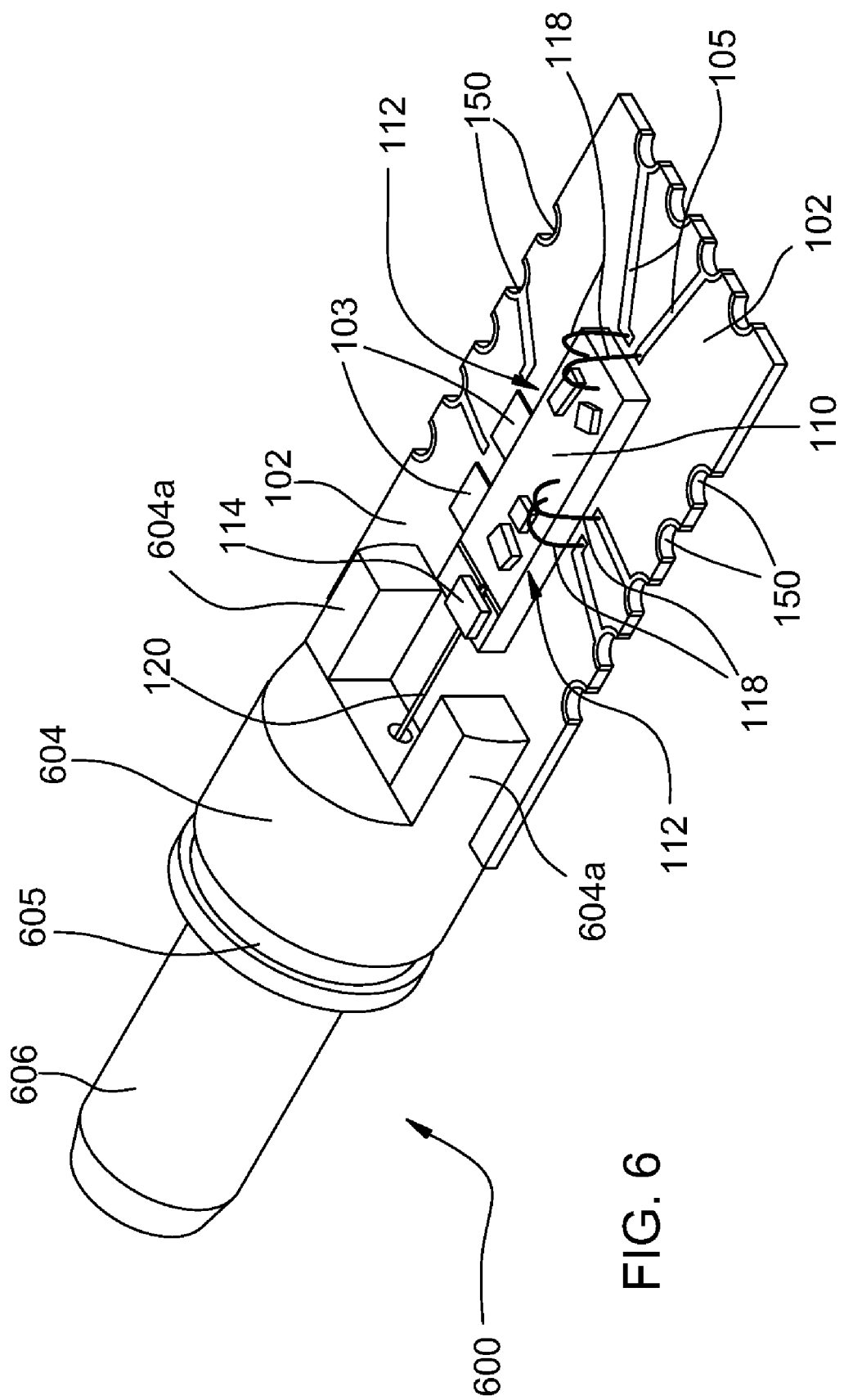
FIG. 6 is a perspective view of an exemplary embodiment of a fiber-coupled optical device mounted on a circuit board.
Figure 9:
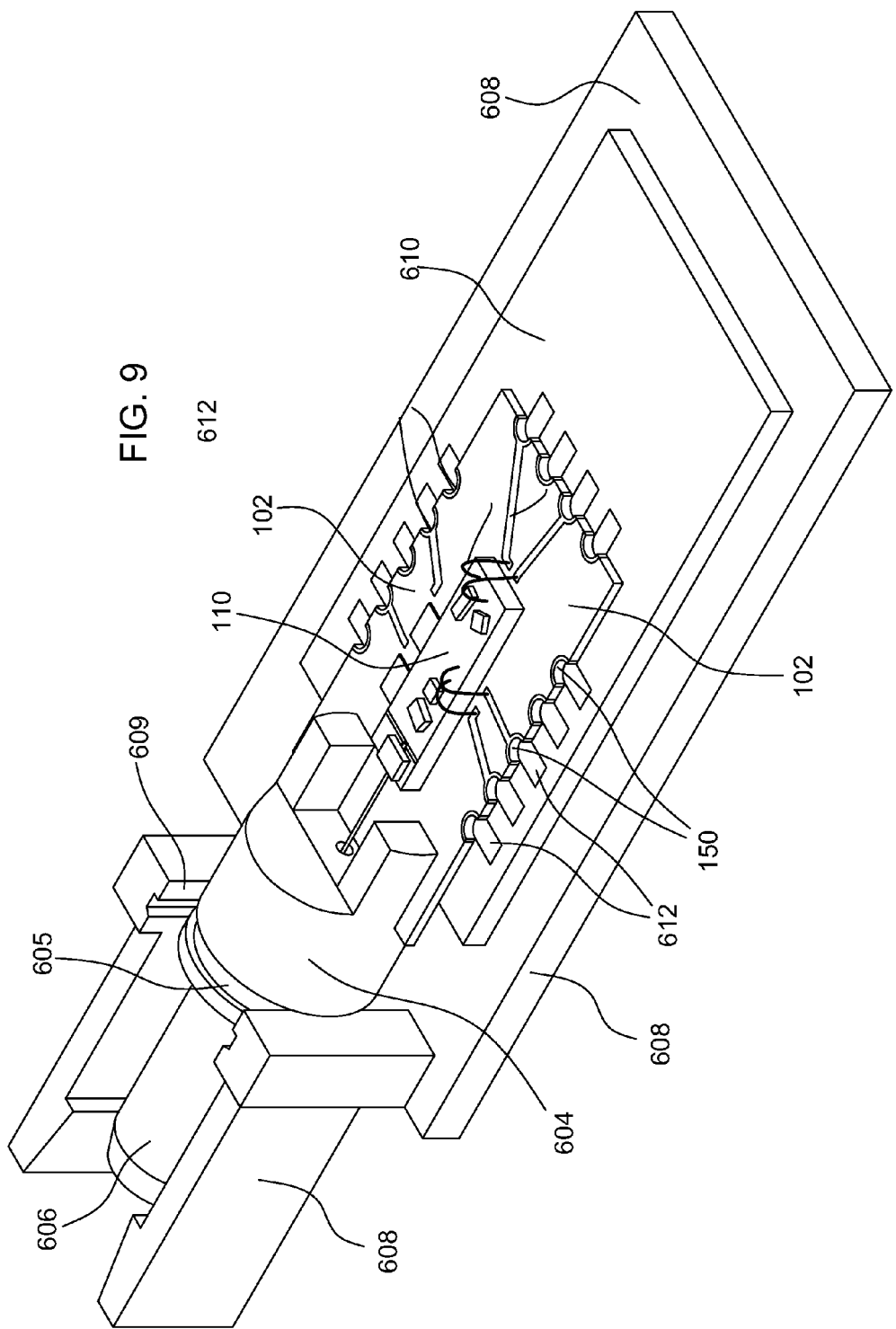
FIG. 9 is a perspective view of an exemplary embodiment of a fiber-coupled optical device mounted on a circuit board, and a receptacle housing therefor.

As shown in FIGS. 6, 8, and 9, device substrate 110 is secured to a substantially flat region of circuit board 102. Likewise, ferrule holder 604 (and hence the ferrule 602 and the second segment of fiber 120) is secured to a substantially flat region of circuit board 1 02. Those two substantially flat regions of circuit board 102 are substantially coplanar. The arrangement of device substrate 110, ferrule holder 604, ferrule 602, and optical fiber 120 results in at least a portion of the fiber 120 being vertically spaced-apart from the regions of the circuit board 102 to which the device substrate 110 and buffer 122 are secured. In the example shown in FIGS. 6-9, ferrule holder 604 includes members 604*a* and 604*b* for engaging circuit board 102. Adhesive can be employed that flows into place during at least a portion of its application, including any of the examples disclosed herein; other suitable means can be employed as well. Grooves, depressions, vias, or protrusions on members 604*a* or 604*b* or on circuit board 102 may enhance the effectiveness of a flowing adhesive, by receiving some of the flowing material which then hardens to form a retaining member. Other suitable arrangements of ferrule holder 604 may be employed for enabling it to be secured to circuit board 102 using adhesive, solder, clamps, clips, pins, retainers, detents, welding (laser, ultrasonic, resistance, etc.), or other suitable means.

The ferrule sleeve 606 is arranged to receive another fiber ferrule of a mating connector (not shown) so as to align an optical fiber within the other fiber ferrule with the distal end of optical fiber 120 for optical end-coupling. To facilitate such alignment, ferrule sleeve may comprise an inner sleeve 606*a* and an outer sleeve 606*b*. The inner sleeve 606*a* can comprise a ceramic split sleeve, for example, arranged for ensuring substantially concentric alignment of fiber ferrule 602 and another fiber ferrule of a mating connector. The outer sleeve 606*b* can have a larger inner diameter than inner sleeve 606*a*, to more readily enable insertion of the other fiber ferrule into outer sleeve 606*b* and to guide the other fiber ferrule into inner sleeve 606*a*. Other suitable arrangements of sleeve 606 may be employed and shall fall within the scope of the present disclosure or appended claims.

The ferrule holder 604 can be arranged or adapted on its outer surface for engaging or mating with a receptacle structure 608 (shown in FIG. 9). A circumferential groove 605 on the outer surface of ferrule holder 604 is shown in the exemplary embodiment of FIGS. 6-9, which receives an inwardly-projecting flange 609 of the receptacle structure 608. Any other suitable mechanical arrangement can be employed for engaging the ferrule holder 604 within the receptacle structure 608, and any such suitable arrangement shall be considered within the scope of the present disclosure or appended claims. The receptacle structure 608 typically is secured to a system circuit board 610. The receptacle structure 608 is positioned on the circuit board 610 so that engagement of the ferrule holder 604 with the receptacle structure 608 results in proper positioning of the circuit board 102 relative to the system circuit board 610 (within acceptable tolerances). Once the ferrule holder 604 is engaged with the receptacle structure 608, the circuit board 102 can be secured to the system circuit board 610 by solder, adhesive, or other suitable means. If soldered, the solder may also provide electrical connections between the circuit board 102 and the system circuit board 610 (as described hereinabove) utilizing contacts 150 (as in the example shown), conductive pins, or other suitable structures. In the example of FIG. 9, engagement of ferrule holder 604 with receptacle structure 608 (which is in turn secured to circuit board 610) results in alignment of contacts 150 on circuit board 102 with contacts 612 on circuit board 610. Alternatively, other electrical connections may be employed between circuit board 102 and system circuit board 600 (e.g., wire bonds). It should be noted that system circuit board 610 can extend beyond the receptacle structure 608 if needed or desired, and is shown smaller than the receptacle structure 608 in FIG. 9 in order to allow the relative positioning of the various parts of the overall assembly to be seen.

For any of the embodiments disclosed herein, multiple fiber-coupled optical devices can be mounted on a single contiguous piece of circuit board material. This may be done in order to construct a system circuit board having multiple fiber-coupled optical devices mounted thereon. Alternatively, multiple fiber-coupled devices can be mounted on a single piece of circuit board material to facilitate manufacture of the board-mounted devices. Examples of such multiple-board assembly processes are illustrated schematically in FIGS. 10 and 11. In each of these examples, multiple circuit boards 102 are all part of a single piece of circuit board material that includes a connecting strip 702. If needed or desired, the circuit board material can be scored, partially cut, or otherwise adapted to facilitate subsequent separation of the circuit boards 102 from the strip 702. While the multiple circuit boards remain attached to the strip 702, corresponding optical device substrates 110 (with optical devices assembled thereon) are secured to each circuit board 102, and any necessary electrical connections are made between the device substrates 110 and electrical traces on the corresponding circuit board 102.

Figure 10:
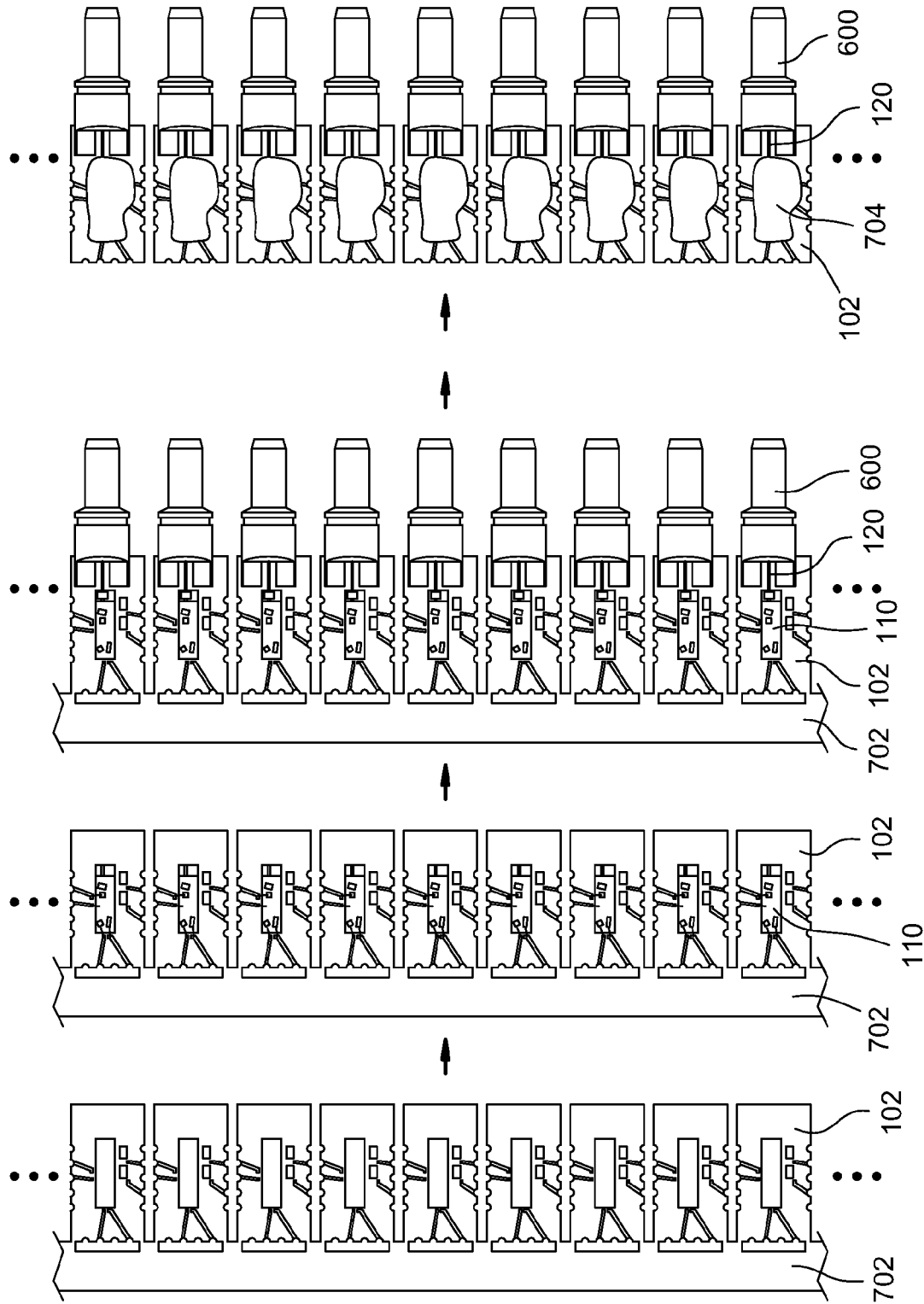
FIG. 10 illustrates schematically a process for mounting fiber-coupled optical devices on circuit boards.
Figure 11:
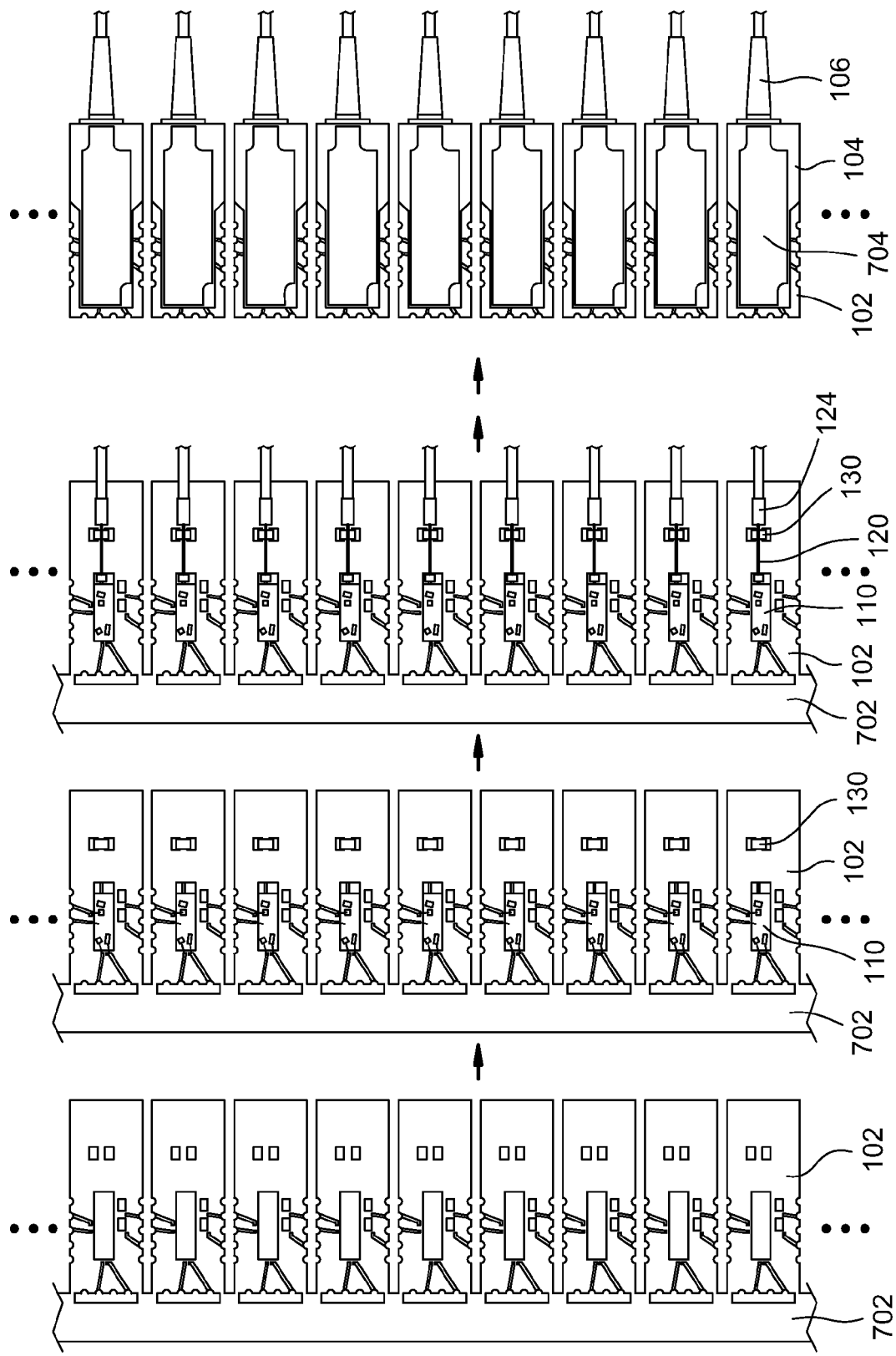
FIG. 11 illustrates schematically a process for mounting fiber-coupled optical devices on circuit boards.

With the multiple circuit boards 102 still attached to strip 702, corresponding optical fibers 120 are then assembled onto each circuit board 102. In FIG. 10, the optical fibers 120 are secured to the circuit boards with receptacle connectors 600 (as in FIGS. 6-9). After applying encapsulant 704, the circuit boards 102 are separated from the strip 702 to yield multiple individual "boardlet"-mounted, fiber-coupled optical devices. In FIG. 11, corresponding fibers 120 are secured to the circuit boards 102 with adhesive, support members 130, and crimp tube 124 (as in FIGS. 1-3). After assembling housings 104, applying encapsulant 704, and assembling strain-relief structures 106, the circuit boards 102 are separated from the strip 702 to yield multiple individual "boardlet"-mounted, fiber-coupled optical devices. Any suitable method for securing fiber 120 to device substrate 110 and circuit board 102 may be employed in such a multiple-board assembly process, and all such suitable methods shall fall within the scope of the present disclosure or appended claims. Such multiple-board assembly procedures (as in the examples of FIGS. 10 and 11) enable significant economies to be realized in the manufacture of large numbers of boardlet-mounted, fiber-coupled optical devices.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or", "only one of . . . ", or similar language; or (ii) two or more of the listed alternatives are mutually exclusive within the particular context, in which case "or" would encompass only those combinations involving non-mutually-exclusive alternatives. For purposes of the present disclosure or appended claims, the words "comprising", "including", and "having" shall be construed as open ended terminology, with the same meaning as if the phrase "at least" were appended after each instance thereof.

It is intended that equivalents of the disclosed exemplary embodiments and methods shall fall within the scope of the present disclosure and/or appended claims. It is intended that the disclosed exemplary embodiments and methods, and equivalents thereof, may be modified while remaining within the scope of the present disclosure or appended claims.

What is claimed is:

1. An optical apparatus, comprising:
an optical fiber;
an optical device on a device substrate, the device substrate having a groove for receiving the optical fiber and positioning a proximal end of the optical fiber to establish optical coupling between the optical fiber and the optical device, a first segment at or near the proximal end of the optical fiber being secured to the device substrate in the groove;
a circuit board, the device substrate being mounted on a first substantially flat region of the circuit board, a second segment of the optical fiber being secured to a second substantially flat region of the circuit board, the second fiber segment being distal to the first fiber segment, the first and second regions of the circuit board being substantially coplanar so that at least a portion of the optical fiber between the first and second segments is vertically spaced-apart from the first and second regions of the circuit board; and at least one electrical connection between the optical device and the circuit board.

2. The apparatus of claim 1, further comprising adhesive for securing the second fiber segment to the circuit board.

3. The apparatus of claim 2, wherein the adhesive comprises a hardened material that had flowed into place during at least a portion of its application.

4. The apparatus of claim 2, wherein the adhesive comprises cured polymer, reflowed polymer, reflowed solder, reflowed glass, or fused glass frit.

5. The apparatus of claim 2, wherein the optical fiber includes a buffer on the second fiber segment, the buffer being secured to the circuit board by the adhesive, the buffer thereby securing the second fiber segment to the circuit board vertically spaced-apart from the second region thereof.

6. The apparatus of claim 5, further comprising a crimp tube crimped onto the buffer, the crimp tube being secured to the circuit board by the adhesive thereby securing the buffer to the circuit board.

7. The apparatus of claim 6, wherein the adhesive covers at least a portion of the crimp tube and at least a portion of the buffer beyond an end of the crimp tube.

8. The apparatus of claim 2, further comprising protrusions on or depressions in the circuit board positioned near the second fiber segment and at least partly covered by the adhesive.

9. The apparatus of claim 8, wherein at least one depression in the circuit board comprises a via through the circuit board at least partially filled with the adhesive.

10. The apparatus of claim 8, wherein at least one protrusion comprises a member secured to the circuit board at least partly covered by the adhesive.

11. The apparatus of claim 2, wherein a segment of the optical fiber between the first and second fiber segments is substantially free of adhesive.

12. The apparatus of claim 1, further comprising at least one electrical contact formed on at least one edge of the circuit board and electrically coupled to the optical device via the circuit board.

13. The apparatus of claim 12, wherein the electrical contact comprises a portion of an electrical trace deposited on the circuit board and extending onto the edge of the circuit board.

14. The apparatus of claim 12, wherein the electrical contact is formed within a recessed portion of the edge of the circuit board.

15. The apparatus of claim 10, wherein the secured member comprises an electrical component.

16. The apparatus of claim 1, further comprising adhesive means for securing the second fiber segment to the circuit board.

17. The apparatus of claim 1, further comprising a fiber support member on the circuit board beneath a portion of the optical fiber between the first and second fiber segments, at least a portion of the optical fiber between the first and second fiber segments being secured to the fiber support member.

18. The apparatus of claim 17, further comprising adhesive for securing the optical fiber to the fiber support member.

19. The apparatus of claim 18, wherein the adhesive comprises a hardened material that had flowed into place during at least a portion of its application.

20. The apparatus of claim 18, wherein the adhesive comprises cured polymer, reflowed polymer, reflowed solder, reflowed glass, or fused glass frit.

21. The apparatus of claim 17, wherein the fiber support member comprises an electrical component.

22. The apparatus of claim 17, further comprising adhesive means for securing the optical fiber to the fiber support member.

23. The apparatus of claim 1, further comprising a fiber retainer positioned over at least a portion of the groove and secured to the device substrate to secure the first fiber segment to the device substrate in the groove.

24. The apparatus of claim 23, further comprising adhesive for securing the fiber retainer to the device substrate.

25. The apparatus of claim 23, wherein the adhesive comprises a hardened material that had flowed into place during at least a portion of its application.

26. The apparatus of claim 24, wherein the adhesive comprises cured polymer, reflowed polymer, reflowed solder, reflowed glass, or fused glass frit.

27. The apparatus of claim 23, further comprising adhesive means for securing the fiber retainer to the device substrate.

28. The apparatus of claim 1, further comprising an index-matching material between the optical device and the proximal end of the optical fiber.

29. The apparatus of claim 1, further comprising an encapsulant substantially covering the optical device, the device substrate, and the first and second fiber segments.

30. The apparatus of claim 1, further comprising a housing secured to the circuit board and having walls that substantially surround an area of the circuit board containing the optical device, the device substrate, and the first and second fiber segments.

31. The apparatus claim 30, further comprising an encapsulant substantially covering the area of the circuit board surrounded by the housing.

32. The apparatus of claim 1, further comprising:

a ferrule holder secured to the circuit board;

a fiber ferrule received within and secured to the ferrule holder and having the second fiber segment received therethrough and secured thereto, a distal end of the optical fiber being substantially flush with a distal end of the fiber ferrule, the fiber ferrule and ferrule holder thereby securing the second fiber segment to the circuit board vertically spaced-apart from the second region thereof; and a ferrule sleeve received within and secured to the ferrule holder, the distal end of the fiber ferrule being received within a proximal end of the ferrule sleeve and recessed from a distal end of the ferrule sleeve.

33. The apparatus of claim 32, further comprising adhesive for securing the ferrule holder to the circuit board.

34. The apparatus of claim 33, wherein the adhesive comprises a hardened material that had flowed into place during at least a portion of its application.

35. The apparatus of claim 33, wherein the adhesive comprises cured polymer, reflowed polymer, reflowed solder, reflowed glass, or fused glass frit.

36. The apparatus of claim 32, wherein the ferrule holder includes a pair of proximally-extending members secured to the circuit board.

37. The apparatus of claim 32, further comprising adhesive means for securing the ferrule holder to the circuit board.

38. The apparatus of claim 32, further comprising a receptacle housing, wherein:

an outer surface of the ferrule holder is adapted for engaging an inner surface of the receptacle housing;

the ferrule housing is received within the receptacle housing and engaged therewith; and the ferrule holder, the ferrule sleeve, and the receptacle housing are arranged to engage a mating optical fiber connector and establish optical end-coupling between the distal end of the optical fiber and another optical fiber.

39. The apparatus of claim 38, further comprising a system circuit board, wherein:
the receptacle housing is secured to the system circuit board;
the circuit board is secured to the system circuit board; and
the circuit board and the system circuit board are connected by at least one electrical connection.

40. The apparatus of claim 1, further comprising at least one electrical component or integrated circuit mounted on the circuit board and electrically coupled to the optical device through the electrical connection.

41. A method for making an optical apparatus, comprising:
mounting on a first substantially flat region of a circuit board a device substrate having an optical device and a groove thereon;
establishing at least one electrical connection between the optical device and the circuit board;
securing a first segment at or near a proximal end of an optical fiber to the device substrate in the groove, the groove positioning the proximal end of the optical fiber to establish optical coupling between the optical fiber and the optical device; and
securing to a substantially flat second region of the circuit board a second segment of the optical fiber, the second fiber segment being distal to the first fiber segment, the first and second regions of the circuit board being substantially coplanar so that at least a portion of the optical fiber between the first and second segments is vertically spaced-apart from the first and second regions of the circuit board.

42. The method of claim 41, further comprising applying adhesive for securing the second fiber segment to the circuit board.

43. The method of claim 42, wherein a segment of the optical fiber between the first and second fiber segments is left substantially free of adhesive.

44. The method of claim 41, further comprising: forming at least one electrical contact on at least one edge of the circuit board; and electrically coupling the at least one electrical contact to the optical device via the circuit board.

45. The method of claim 44, wherein the electrical contact comprises a portion of an electrical trace deposited on the circuit board and extending onto the edge of the circuit board.

46. The method of claim 44, wherein the electrical contact is formed within a recessed portion of the edge of the circuit board.

47. The method of claim 42, wherein applying the adhesive comprises flowing a precursor material into place and causing the precursor material to harden to form the adhesive.

48. The method of claim 42, wherein the adhesive comprises cured polymer, reflowed polymer, reflowed solder, reflowed glass, or fused glass frit.

49. The method of claim 42, wherein the optical fiber includes a buffer on the second fiber segment, and securing the second fiber segment to the circuit board comprises applying the adhesive for securing the buffer to the circuit board thereby securing the second fiber segment to the circuit board vertically spaced-apart from the second region thereof.

50. The method of claim 49, further comprising crimping a crimp tube onto the buffer, wherein securing the buffer to the circuit board comprises applying the adhesive for securing the crimp tube to the circuit board thereby securing the buffer to the circuit board.

51. The method of claim 50, further comprising covering at least a portion of the crimp tube and at least a portion of the buffer beyond an end of the crimp tube with the adhesive.

52. The method of claim 42, further comprising providing protrusions on or depressions in the circuit board positioned near the second fiber segment, and at least partly covering the protrusions or depressions with the adhesive.

53. The method of claim 52, further comprising forming at least one via through the circuit board and at least partially filling the via with the adhesive.

54. The method of claim 52, further comprising securing at least one member to the circuit board to protrude from the circuit board, and at least partly covering the member with the adhesive.

55. The method of claim 54, wherein the secured member comprises an electrical component.

56. The method of claim 41, wherein securing the second fiber segment to the circuit board comprises adhering the second fiber segment to the circuit board.

57. The method of claim 41, further comprising:
positioning a fiber support member on the circuit board beneath at least a portion of the optical fiber between the first and second fiber segments; and
securing at least a portion of the optical fiber between the first and second fiber segments to the fiber support member.

58. The method of claim 57, further comprising applying adhesive for securing the optical fiber to the fiber support member.

59. The method of claim 58, wherein applying the adhesive comprises flowing a precursor material into place and causing the precursor material to harden to form the adhesive.

60. The method of claim 58, wherein the adhesive comprises cured polymer, reflowed polymer, reflowed solder, reflowed glass, or fused glass frit.

61. The method of claim 57, wherein the fiber support member comprises an electrical component.

62. The method of claim 41, further comprising securing a fiber retainer to the device substrate over at least a portion of the groove to secure the first fiber segment to the device substrate in the groove.

63. The method of claim 62, further comprising applying adhesive for securing the fiber retainer to the device substrate.

64. The method of claim 63, wherein applying the adhesive comprises flowing a precursor material into place and causing the precursor material to harden to form the adhesive.

65. The method of claim 63, wherein the adhesive comprises cured polymer, reflowed polymer, reflowed solder, reflowed glass, or fused glass frit.

66. The method of claim 62, wherein securing the fiber retainer to the device substrate comprises adhering the fiber retainer to the device substrate.

67. The method of claim 41, further comprising placing index-matching material between the optical device and the proximal end of the optical fiber.

68. The method of claim 41, further comprising substantially covering the optical device, the device substrate, and the first and second fiber segments with an encapsulant.

69. The method of claim 41, further comprising securing a housing to the circuit board, the housing having walls that substantially surround an area of the circuit board containing the optical device, the device substrate, and the first and second fiber segments.

70. The method claim 59, further comprising substantially covering the area of the circuit board surrounded by the housing with an encapsulant.

71. The method of claim 41, further comprising:
securing a ferrule holder secured to the circuit board;
securing the second fiber segment within a fiber ferrule, a distal end of the optical fiber being substantially flush with a distal end of the fiber ferrule; and
securing a ferrule sleeve within the ferrule holder, the distal end of the fiber ferrule being received within a proximal end of the ferrule sleeve and recessed from a distal end of the ferrule sleeve, the fiber ferrule and ferrule holder thereby securing the second fiber segment to the circuit board vertically spaced-apart from the second region thereof.

72. The method of claim 71, further comprising applying adhesive for securing the ferrule holder to the circuit board.

73. The method of claim 72, wherein applying the adhesive comprises flowing a precursor material into place and causing the precursor material to harden to form the adhesive.

74. The method of claim 72, wherein the adhesive comprises cured polymer, reflowed polymer, reflowed solder, reflowed glass, or fused glass frit.

75. The method of claim 71, wherein the ferrule holder includes a pair of proximally-extending members that secured to the circuit board.

76. The method of claim 71, further comprising assembling the ferrule holder within a receptacle housing, wherein:
an outer surface of the ferrule holder is adapted for engaging an inner surface of the receptacle housing; and
upon assembly the ferrule holder, the ferrule sleeve, and the receptacle housing are arranged to engage a mating optical fiber connector and establish optical end-coupling between the distal end of the optical fiber and another optical fiber.

77. The method of claim 76, further comprising:
securing the receptacle housing to a system circuit board;
securing the circuit board to the system circuit board; and
establishing at least one electrical connection between the circuit board and the system circuit board.

78. The method of claim 41, further comprising:
mounting at least one electrical component or integrated circuit on the circuit board; and
electrically coupling the electrical component or integrated circuit to the optical device through the electrical connection.

79. A method for making a plurality of optical apparatus, comprising:
mounting on substantially flat, substantially coplanar device regions of circuit board material multiple device substrates each having thereon a corresponding optical device and a corresponding groove thereon;
establishing at least one electrical connection between each optical device and the circuit board material;
securing a first segment at or near a proximal end of a corresponding optical fiber to each device substrate in the corresponding groove, the corresponding groove positioning the proximal end of the corresponding optical fiber to establish optical coupling between the corresponding optical fiber and the corresponding optical device;
securing to substantially flat, substantially coplanar fiber regions of the circuit board material a second segment of each corresponding optical fiber, each second fiber segment being distal to the corresponding first fiber segment, the device and fiber regions of the circuit board material being substantially coplanar so that at least a portion of each optical fiber between its first and second segments is vertically spaced-apart from the device and fiber regions of the circuit board; and
dividing the circuit board material into individual circuit boards, each having thereon a corresponding device substrate and a corresponding optical fiber secured thereto.

* * * * *